US007767135B2

(12) United States Patent
Guilfoyle et al.

(10) Patent No.: US 7,767,135 B2
(45) Date of Patent: Aug. 3, 2010

(54) METHOD OF FORMING A SINTERED MICROFLUIDIC DEVICE

(75) Inventors: Diane Kimberlie Guilfoyle, Painted Post, NY (US); Paul John Shustack, Elmira, NY (US); Lung-Ming Wu, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/975,414

(22) Filed: Oct. 19, 2007

(65) Prior Publication Data

US 2009/0102101 A1  Apr. 23, 2009

(51) Int. Cl.
| C04B 33/34 | (2006.01) |
| B28B 1/00 | (2006.01) |
| C04B 33/32 | (2006.01) |
| C04B 33/36 | (2006.01) |
| B28B 3/00 | (2006.01) |
| B28B 5/00 | (2006.01) |

(52) U.S. Cl. .................................. 264/629; 264/603
(58) Field of Classification Search ................. 264/603, 264/629–631, 646, 669–670; 65/17.3
See application file for complete search history.

(56) References Cited

U.S. PATENT DOCUMENTS

| 5,021,213 | A | * | 6/1991 | Nishio et al. ............... 419/36 |
| 5,380,179 | A | * | 1/1995 | Nishimura et al. .......... 419/36 |
| 5,498,382 | A | * | 3/1996 | Seitz et al. .................. 264/6 |
| 5,602,197 | A | * | 2/1997 | Johnson et al. ............. 524/275 |
| 5,853,446 | A |   | 12/1998 | Carre et al. ................ 65/17.3 |
| 5,963,771 | A | * | 10/1999 | Chan et al. .................. 419/2 |
| 5,964,991 | A | * | 10/1999 | Kawasaki et al. ........... 204/282 |
| 6,179,884 | B1 | * | 1/2001 | Kawasaki et al. .......... 29/623.1 |
| 6,352,763 | B1 | * | 3/2002 | Dillon et al. ............... 428/325 |
| 6,596,237 | B1 | * | 7/2003 | Borrelli et al. ............. 422/100 |
| 6,616,887 | B2 | * | 9/2003 | Chiu et al. .................. 264/496 |
| 6,769,444 | B2 | * | 8/2004 | Guzman et al. ........... 137/15.01 |
| 2002/0029588 | A1 |   | 3/2002 | Themont et al. ........... 65/17.6 |
| 2002/0102411 | A1 | * | 8/2002 | Dillon et al. ............... 428/426 |
| 2003/0192587 | A1 |   | 10/2003 | Guzman et al. ........... 137/15.01 |
| 2004/0058614 | A1 | * | 3/2004 | Chiu et al. .................. 445/24 |
| 2005/0075411 | A1 | * | 4/2005 | Wenning et al. ............ 522/71 |
| 2005/0156362 | A1 | * | 7/2005 | Arnold et al. ............... 264/618 |
| 2005/0156522 | A1 | * | 7/2005 | Kim et al. .................. 313/582 |
| 2007/0123410 | A1 |   | 5/2007 | Morena et al. ............. 501/65 |

FOREIGN PATENT DOCUMENTS

EP  0866487 A1  9/1998

* cited by examiner

*Primary Examiner*—Steven P Griffin
*Assistant Examiner*—Jodi Cohen
(74) *Attorney, Agent, or Firm*—Gregory V. Bean (57) ABSTRACT

Disclosed is a method of forming a structured sintered article including providing a mixture comprising a sinterable particulate material and a binder, the binder comprising, as a function of total resin content of the binder, at least 50% by weight of a thermoplastic binder material and at least 5% by weight of a radiation-curable binder material; shaping the mixture with a mold to form a structure; setting the structure by cooling the structure or by allowing the structure to cool; separating the structure from the mold; irradiating the structure so as to at least partially cure the radiation-curable binder material, and debinding and sintering the structure so as to form a structured sintered article. Shaping may include forming a structure having one or more open channels, and sintering may include sintering in together in contact with at least one additional structure so as to cover or enclose the channels.

4 Claims, 5 Drawing Sheets

METHOD OF FORMING A SINTERED MICROFLUIDIC DEVICE

BACKGROUND

The present invention relates generally to methods of forming structured sintered articles and particularly to methods of forming structured sintered articles comprising one or more of glass, ceramic, and glass-ceramic particles. The disclosed method has been particularly developed for and may be particularly useful in the manufacture of microfluidic devices and similar structures.

Associates of the present inventors have previously developed techniques for forming glass rib structures, as disclosed for example in U.S. Pat. No. 5,853,446, and related methods for producing microfluidic devices, as disclosed for example in U.S. Pat. No. 6,769,444, both of which are assigned to the Assignee of the present application. These previously developed methods include, among other steps: providing a mixture of a binder and sinterable particles, such as glass, glass-ceramic or ceramic particles or mixtures thereof; molding the mixture to form a desired structure; setting and demolding the structure; and debinding and sintering the structure. Setting is performed by heating the mixture for thermosetting binders, by cooling or allowing the mixture to cool for thermoplastic binders, or by irradiating the mixture for radiation-curable binders. In U.S. Pat. No. 5,853,446 is disclosed that radiation-curable binders may take the form of "hybrid" binders—mixtures of radiation-curable binder materials and thermoplastic binder materials—providing fast radiation-setting and at the same time achieving a more complete debinding or "burnout" of the binder similar to that of thermoplastic binders. In the purely UV or hybrid UV binder embodiments, fast-setting by irradiation is used while the mixture is in the disclosed roll mold and/or simultaneously with removal of the mixture from the roll mold, in order to set the structure and aid removal of the structure from the mold.

SUMMARY

For forming the rather complex structures that may be desirable in a microfluidic device, flat molding processes similar to that disclosed in U.S. Pat. No. 6,769,444 have proven more reliable and adaptable than roll-molding such as disclosed in U.S. Pat. No. 5,853,446. A disadvantage of the flat molding process, however, is that the flat molding process generally requires the use of absorbent material packed around and into the recesses of the formed or structured mixture prior to debinding and sintering, to assist in maintaining the shape of the structured mixture during debinding and sintering. Alumina and more recently calcium carbonate, which both can withstand high temperatures, have been used by the inventors or their colleagues for this purpose. The use of alumina or calcium carbonate is undesirable, however, in that it must later be removed, adding to the number and expense of process steps and providing a potential source of contamination. Furthermore, etching, a typical process available to remove calcium carbonate from glass, is not very environmentally friendly.

Without some absorbent material covering and packing the structure, however, the shape of the structure is not always retained to the degree that may be desired. In particular, without the use of an absorbent material to help maintain the shape of the green structure, as the structure is debinded and sintered, the structure can soften or slump. Although radiation-curable binders and thermo-setting binders can maintain the shape of the structure to a greater degree than thermoplastic binders during debinding and sintering, the use of radiation-curable binders for setting or curing in contact with a mold can cause difficulty in separating shaped structures from a mold, as well as difficulty in achieving desired levels of curing or setting, and in achieving evenly distributed curing or setting.

The present invention provides a method of forming a structured sintered article including providing a mixture comprising a sinterable particulate material and a binder, the binder comprising, as a function of total resin content of the binder, at least 50% by weight of a thermoplastic binder material and at least 5% by weight of a radiation-curable binder material; shaping the mixture with a mold to form a structure; setting the structure by cooling the structure or by allowing the structure to cool; separating the structure from the mold; irradiating the structure so as to at least partially cure the radiation-curable binder material, and debinding and sintering the structure so as to form a structured sintered article. Shaping may include forming a structure having one or more open channels, and sintering may include sintering in together in contact with at least one additional structure so as to cover or enclose the channels.

In the methods according to the present invention, the thermoplastic binder, desirably a low melting binder, remains the primary binder and the binder that performs the function of setting or initially curing the structure, allowing for mold separation and any necessary initial handling. This provides for easily controlled and complete curing by simple means—cooling or allowing the structure to cool. The thermoplastic binder can also provide good flow and lubrication properties during debinding, minimizing cracking and other issues that might occur with a heavily crosslinked polymer as the primary binder. A sufficient amount of radiation-cured resin acts as a rheology modifier belonging to the thermoset family; therefore it does not re-melt continues to be an effective rheology modifier up to and possibly even beyond the thermoplastic binder debinding temperature range, thus maintaining the shape of the structures being debinded and sintered, without the use of particulate material packed around and into the structure.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description, serve to explain the principles and operations of the invention.

DETAILED DESCRIPTION

Reference will now be made in detail to the presently preferred embodiments of the invention, example of which are illustrated in the accompanying drawings. Whenever possible, the same reference numerals will be used throughout the drawings to refer to the same or like parts.

FIGS. 1A-1E are cross sections of one instance of a structured sintered article at various points in a process of being formed according to one or more methods of the present invention. With reference to FIG. 1A, the methods generally include providing a mixture 20 comprising a sinterable particulate material and a binder, the binder comprising, as a function of total resin content of the binder, at least 50% by weight of a thermoplastic binder material, and at least 5% by weight of a radiation-curable binder material. The mixture 20 is shaped with a mold 22 so as to form a structure 26.

Figure 1:
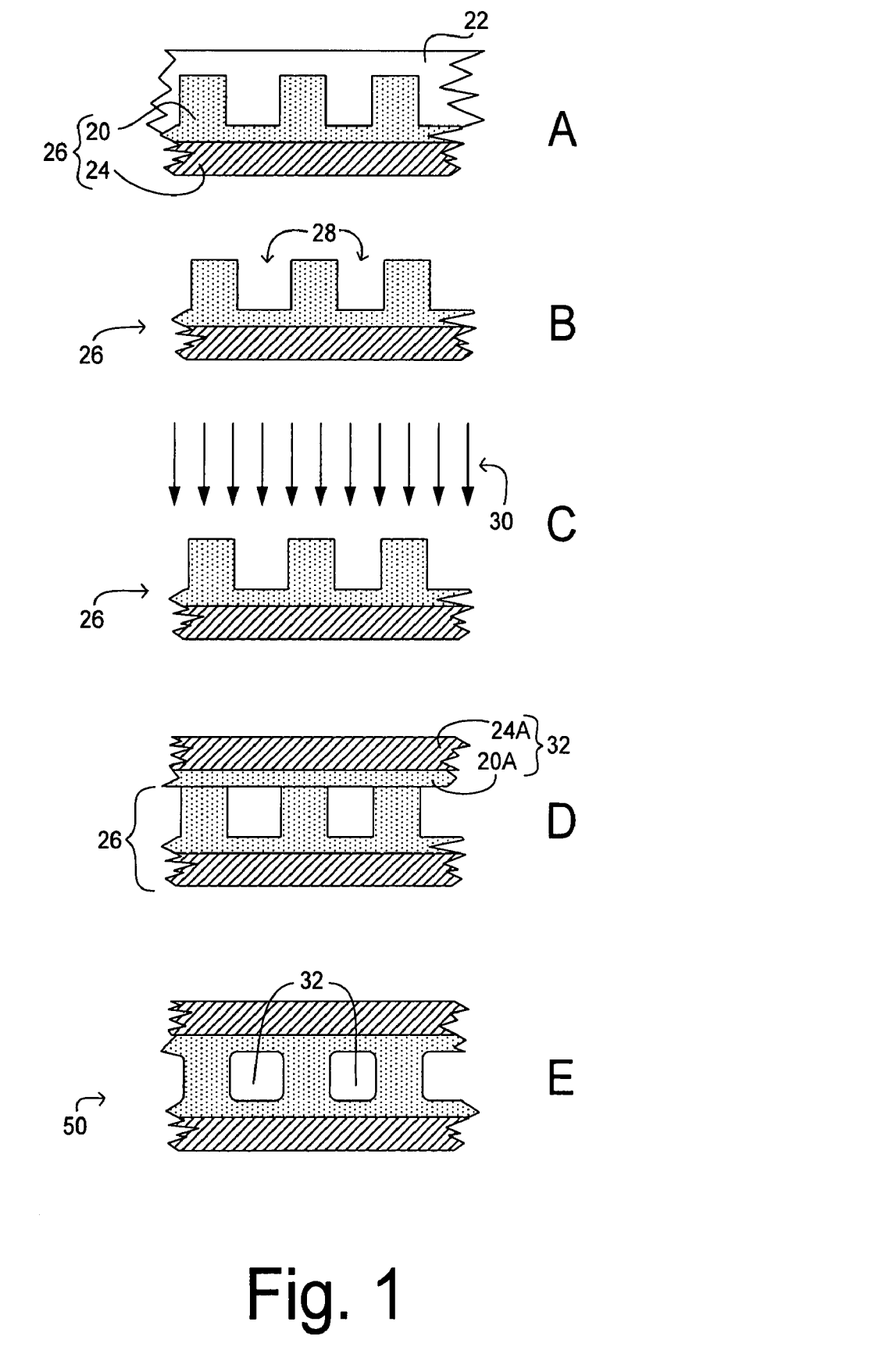
FIGS. 1A-1E are cross sections of one instance of a structured sintered article at various points in a process of being formed according to one or more methods of the present invention.

In the example of FIG. 1, the mold 22 is used to shape the mixture 20 while the mixture 20 is in contact with a substrate 24, which in the embodiment of FIG. 1 forms part of the resulting shaped structure 26 and the final structured sintered article 50. The step of shaping the mixture 20 with a mold may beneficially be used to form the particular type of structure shown in FIG. 1, a structure 26 having one or more open channels 28. The mixture 20 may be molded at an elevated temperature as needed or desired, and the thermal energy may be supplied in various ways, such as heating the mold, preheating the mixture, and the like.

After the mixture 20 is shaped with the mold 22, the resulting structure 26 is then set by cooling the structure 26 or by allowing the structure 26 to cool. The structure 26 is then separated from the mold 22, resulting in a structure 26 comprising the shaped mixture 20 of FIG. 1B.

After the structure 26 is separated from the mold 22, the structure 26 is irradiated with radiation 30, as depicted diagrammatically in the cross-section of FIG. 1C, so as to at least partially cure the radiation-curable binder material in the mixture 20. Desirably, the structure 26 is irradiated sufficiently such that the resulting yield stress of the mixture 20 is at least 8 Pa (Pascal) at a temperature of 100° C. The irradiation lightly crosslinks the irradiation-curable binder material to provide shaped objects having dimensional stability above the critical shear yield stress of 8 Pa. High yield stress allows molded objects to maintain shapes and avoid distortion and slumping as temperature is raised up to the temperature at which debinding occurs. The crosslinking network acts to lock the particles in place and allows the thermoplastic binder material to melt and vaporize or burn out without the structure slumping. The degree of binder crosslinking is controllable by adjusting the radiation-curable thermoplastic ratio and/or the dose of radiation.

The methods and materials described in the examples below have been shown to be capable of producing yield stresses of the mixture, after irradiation, of 100 Pa or greater at temperatures in the range of 70 to 120° C. The radiation 30 need not be parallel, and need not come only from the direction depicted in the figure, but can be delivered in any suitable fashion, including through the substrate 24 (in the upward direction in the orientation of the figure).

The curing radiation 30 is desirably UV radiation, but other radiation such as visible, electron beam, and others may also be adapted for use in the present invention. The radiation-curable binder material may be a UV-curable material, such as one or more acrylates, methacrylates, a vinyls, epoxies, thiols, styrenics, and combinations thereof. Particularly good performance in the examples below was found using acrylated oligomers, particularly a polyester acrylated oligomer. Although the curable resin composition currently most preferred is cured using free radical initiation, cationically curable compositions are possible.

Desirably, the sinterable particulate material used in the mixture 20 is a particulate material transparent to the radiation 30 employed in the step of irradiating, such as transparent to UV radiation if that is the type employed. Presently preferred materials are glasses, particularly those transparent to UV radiation, such as borosilicate glasses, alumina-containing borosilicate glasses, glass ceramics, ceramics, and mixtures thereof, and presently most preferred is glass. Useful applications may extend, however, to sinterable particles not generally transparent to polymerizing radiation, such as metallic particles, where the desired structure's shape and thickness permit.

After the structure 26 is irradiated as depicted in FIG. 1C the structure 26 is then debinded and sintered to form a structured sintered article 50, as shown in the cross section of FIG. 1E. In the case of the article 50 of FIG. 1, an optional step is included, depicted in FIG. 1D, of placing at least one additional structure 32 in contact with the structure 26. In the embodiment shown, the optional additional structure 32 includes a mixture 20A having the same or similar constituents as the mixture 20, and a substrate 24A. The sintering step thus optionally includes sintering the structure 26 in contact with at least one additional structure 32. A weight or other means of applying a force may be applied in the direction across the contact of the structures 26 and 32 during sintering. The result in this particular embodiment is to cover or enclose the channels 28, so as to form a structured sintered 50 article having covered channels 34 formed therein. In the particular embodiment of FIG. 1, the depicted channels 34 form some of the fluidic channels of a microfluidic device. Additional layers of substrates and fluidic channels may also be formed as part of the same device, in the same or subsequent sintering steps, as desired.

Figure 2:
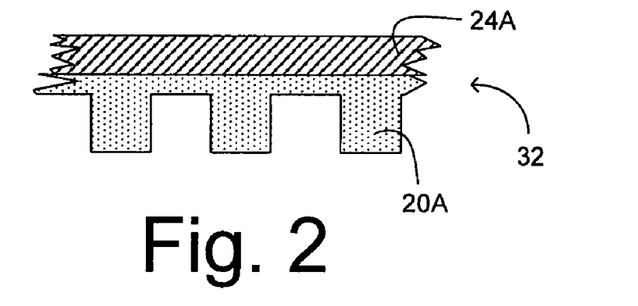
FIG. 2 is a cross section of an alternative structure useful in the step depicted in FIG. 1D.
Figure 3:
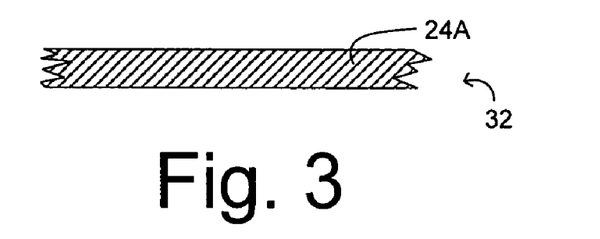
FIG. 3 is a cross section of another alternative structure useful in the step depicted in FIG. 1D.

FIG. 2 is a cross section of an alternative structure 32 useful in the step depicted in FIG. 1D. The structure 32 includes a formed mixture 20A on a substrate 24A. With the particular form of the mixture 20A shown, the structure 32 also includes open channels 28A. These may or may not line up exactly with the channels 28 of structure 26, and can be used to form more complex enclosed or covered channels within a microfluidic device. Another alternative for structure 32 is shown in FIG. 3. A plain substrate 24A or other suitable structure without a mixture formed thereon may be used.

Figure 4:
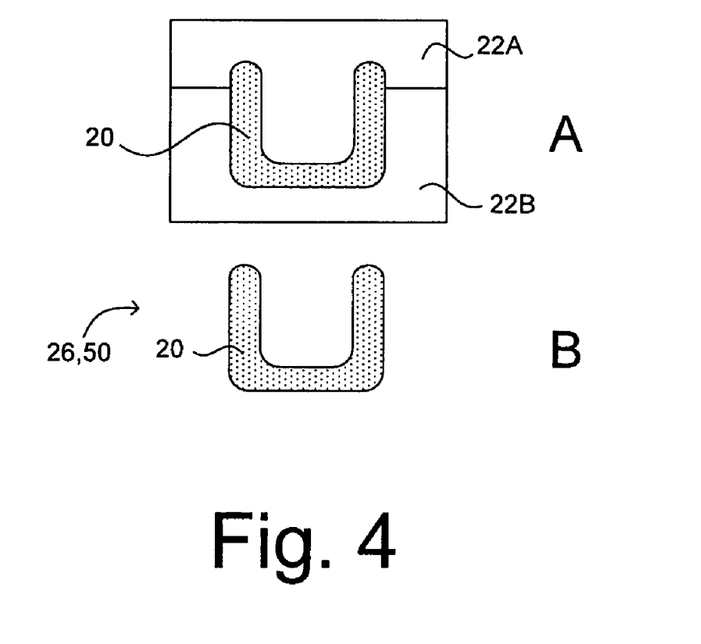
FIGS. 4A-B are cross sections of another instance of a structured sintered article that may be produced by one or more methods of the present invention.

Aspects of another alternative process according to the methods of the present invention are depicted n FIGS. 4A-B. As shown in FIG. 4A, the mold used in the methods of the present invention may take the form of mold halves 22a and 22b that cooperate to form the mixture 20 into a structure 26 without a substrate. The molding process may be press-molding, casting, injection-molding, vacuum-assisted molding, or other suitable process. The structured sintered device 50 resulting after irradiation and debinding and sintering may be a container or crucible. More complex or intricately shaped parts are possible, particularly by forming with injection molding.

When forming devices with covered or enclosed channels 32 as shown in FIG. 1, it may be desirable to debind and/or pre-sinter the articles, so that most if not all binder is removed, prior to stacking as in FIG. 1D and sintering or final sintering. This allows the gases produced by volatizing the binder material to escape easily without having to follow long paths through the resulting covered or enclosed channels 32.

The thermoplastic binder material is desirably one that is easily vaporized or volatized without leaving a significant carbon residue, and one that promotes mold release. Presently preferred are one or more hydrocarbon waxes, waxy alcohols, or mixtures thereof, including simple linear single waxy alcohols or blends, paraffins, microcrystalline waxes, and so forth. The thermoplastic binder material desirably comprises in the range of about 60 to about 90% by weight of the resin content of the binder, with in the range of about 20 to 40% by weight of a radiation-curable binder material. Levels of irradiation-curable binder material greater than 50% typically result in problems with mold separation and in reduced green strength. The binder also typically includes a photoinitiator appropriate to the radiation-curable system employed, and may optionally include a dispersant.

Silicone or silicone-containing molds have been found useful in producing the structures used in microfluidic devices, so it is desirable in embodiments of the present invention used for producing microfluidic devices that the binder components be compatible with silicone. For this purpose it is also desirable that the mixture have a viscosity in the range of 25 to about 50 Pa·sec (Pascal-seconds) at a shear rate of about 2.36/second at about 75° C., for appropriate formability in the molding process.

Figure 5:
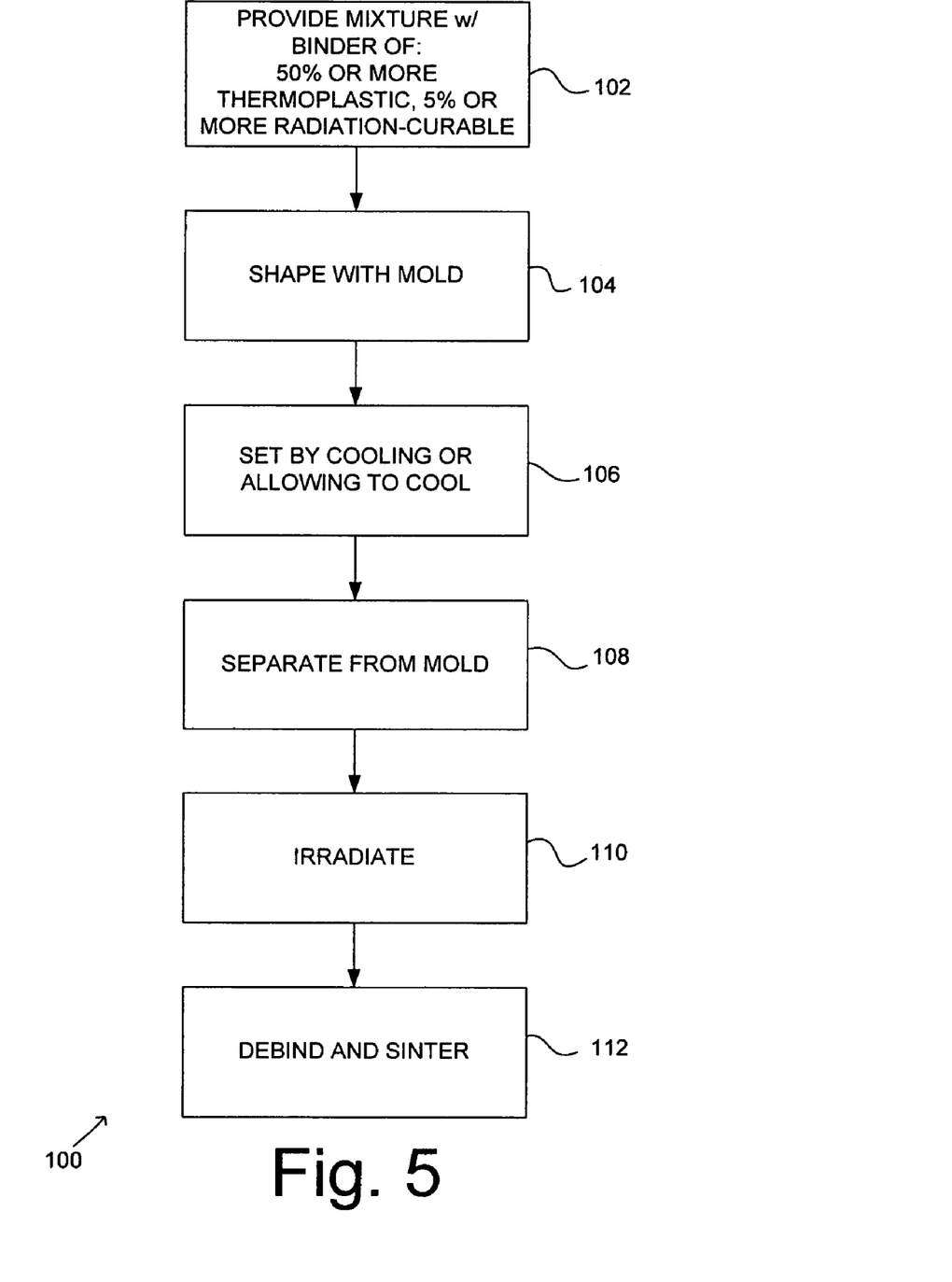
FIG. 5 is a flowchart depicting an embodiment of the method of the present invention.

The steps of a method according to an embodiment of the present invention may be represented in a flowchart such as the flowchart 100 of FIG. 5. In step 102 a mixture is provided comprising a sinterable particulate material and a binder, the binder comprising, as a function of total resin content of the binder, at least 50% by weight of a thermoplastic binder material and at least 5% by weight of a radiation-curable binder material. In step 104 the mixture is shaped with a mold so as to form a structure. The mixture may be shaped or formed against or on a substrate or other object, as in the embodiments of FIGS. 1-3, or solely within a mold structure, as in the embodiment of FIG. 4, or even with objects included within the mold and/or within the mixture, if desired. In step 106 the structure is set by cooling the structure or by allowing the structure to cool. After the structure is set, the structure is separated from the mold in step 108, and then irradiated so as to at least partially cure the radiation-curable binder material in step 110. Finally in step 112, the structure is debinded and sintered to form a structured sintered article.

Experimental

As shown in Table I below, starting with system of glass particles in a wax-based binder, experiments performed with various ratios of binder to inorganic particles (comparative examples C1-C6), with a special (bimodal) particle size distribution (comparative examples C6 and C7), and with non-radiation curable multi-component binders (comparative examples C8-C13), as well as with materials useful in the inventive process, including a thermoplastic binder material in the form of a wax-based binder and a radiation-curable binder material in the form of a UV binder (examples I1-I5). The materials were processed according to the methods generally described above in connection with FIG. 1 above, but ending at a debinding step, and without stacking or sintering with additional elements. Viscosity of the mixtures at typical molding temperatures were measured as shown in the table, and yield stress of the set and mold-separated structures, or of the set, mold-separated and then irradiated structures, were measured at 100° C., a temperature at which slumping occurs in the wax-based systems used. Results of these measurements are listed in the table. The general shape retention of the structures through debinding and/or pre-sintering was also observed.

Figure 6:
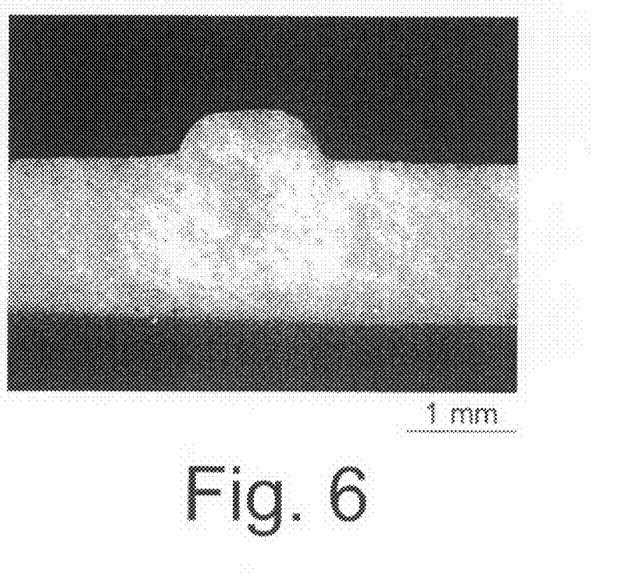
FIG. 6 is a digital photograph of a structured article produced by a comparative process showing some slumping after debinding and before sintering.

In examples C1-C5, the shape of molded structures was generally not well-preserved through debinding. FIG. 6 is a digital photograph of a rectangular ridge formed using the described processes with material corresponding to comparative example C4 after debinding. Softening of the previously sharply rectangular shape can be detected in the figure.

In examples C6 and C7, a bimodal particle distribution was employed. Replication of mold features was not optimal using the mixture in C6, probably due in part to the higher viscosity, but yield stresses were increased, and shape retention was good, even at the modestly increased yield stress of 8 Pa at 100° C. in example C7. The desired viscosity however, at least for the flat molding useful in making microfluidic devices, is in the range of 25 to about 50 Pa·sec at a shear rate of about 2.36/second at about 75° C. Viscosity in these examples was thus outside the preferred limits.

TABLE I

| | | | Glass | | Binder Materials | | | | | Yield Stress (Pa) @ 100 C. | |
| --- | --- | --- | --- | --- | --- | --- | --- | --- | --- | --- | --- |
| Ex. # | Base wax binder Wt. % | UV or other binder Wt. % | Wt. % | Special Particle Distribution | wax/ total resin | UV/ total resin | other binder/ total resin | UV or Other Binder Material | Viscosity (Pa·s) | w/o UV | with UV |
| C1 | 20 | 0 | 80 | NA | 100 | 0 | 0 | NA | $12^6$ | 1.4 | NA |
| C2 | 18 | 0 | 82 | NA | 100 | 0 | 0 | NA | $15^6$ | 2.7 | NA |
| C3 | 16 | 0 | 84 | NA | 100 | 0 | 0 | NA | $26^6$ | 3.7 | NA |
| C4 | 15 | 0 | 85 | NA | 100 | 0 | 0 | NA | $48^6$ | 4 | NA |
| C5 | 14 | 0 | 86 | NA | 100 | 0 | 0 | NA | $51^6$ | 5 | NA |

TABLE I-continued

| Ex. # | Base wax binder Wt. % | UV or other binder Wt. % | Glass Wt. % | Glass Special Particle Distribution | Binder Materials wax/ total resin | Binder Materials UV/ total resin | Binder Materials other binder/ total resin | UV or Other Binder Material | Viscosity (Pa · s) | Yield Stress (Pa) @ 100 C. w/o UV | Yield Stress (Pa) @ 100 C. with UV |
|---|---|---|---|---|---|---|---|---|---|---|---|
| C6  | 17    | 0    | 80 | Bimodal | 100 | 0  | 0  | NA      | 68[6]   | 16.7 | NA |
| C7  | 22    | 0    | 78 | Bimodal | 100 | 0  | 0  | NA      | 11[6]   | 8    | NA |
| C8  | 13    | 5.0  | 82 | NA      | 72  | 0  | 28 | B723[1] | 226[6]  | 14.1 | NA |
| C9  | 12    | 6.0  | 82 | NA      | 67  | 0  | 33 | 2044[2] | 216[6]  | 19.8 | NA |
| C10 | 13    | 5.0  | 82 | NA      | 72  | 0  | 28 | 2045[3] | 248[6]  | 25.9 | NA |
| C11 | 19.25 | 2.75 | 78 | NA      | 88  | 0  | 12 | B723[1] | 74[6]   | 17   | NA |
| C12 | 12    | 4    | 84 | NA      | 75  | 0  | 25 | 400[4]  | 20[6]   | 0.4  | NA |
| C13 | 12    | 4    | 84 | NA      | 75  | 0  | 25 | 500[5]  | 59[6]   | 0.8  | NA |
| I1  | 13.5  | 1.5  | 85 | NA      | 90  | 10 | 0  | 2271[8] | 46[7]   | 4.1  | >100 |
| I2  | 12.75 | 2.25 | 85 | NA      | 85  | 15 | 0  | 2271[8] | 51[7]   | 4.3  | >100 |
| I3  | 12.6  | 2.4  | 85 | NA      | 84  | 16 | 0  | 2271[8] | 53[7]   | 4.6  | >100 |
| I4  | 10.5  | 4.5  | 85 | NA      | 70  | 30 | 0  | 2271[8] | 60[7]   | 4.9  | Not tested |
| I5  | 7.5   | 7.5  | 85 | NA      | 50  | 50 | 0  | 2271[8] | 70[7]   | 3.8  | Not tested |

[1]Neocryl ® B723 (DSM NeoResins)
[2]Elvacite ® 2044 (Lucite International)
[3]Elvacite ® 2045 (Lucite International)
[4]Polywax 400 (Baker Petrolite)
[5]Polywax 500 (Baker Petrolite)
[6]@ 2.36/sec, 80° C.
[7]@ 2.34/sec, 70° C.
[8]Sartomer CN2271 (Sartomer)

For comparative examples with non-radiation curable multi-component binders, some examples with methyl methacrylate polymers were tested (C8-C11), and some with added higher molecular weight waxes, resulting in a multi-component wax binder (C12 and C13).

The addition of methyl methacrylate polymers to the binder in comparative examples C8-C11 provided the desired levels of yield stress—in excess of 8 Pa. The viscosity of these examples was, however, undesirably high.

The use of multi-component wax binders in examples C12 and C13 resulted in even lower yield stresses than in the base wax binder examples in C1-C5. Polywax 700 was also tested with similar results.

For materials useful according to the methods of the invention, experiments were performed using the wax MX 4462 (CERDEC France) at 11.1% by weight of the total mixture, with glass particles at 84.05%, a UV-curable resin at 4.8%, and a photoinitiator (Irgacure 1800, Ciba Specialty Chemicals, Zurich) at 0.05% by weight. UV resins tested include Rahn 01-554 and 01-514 (Rahn AG, Zurich), and Sartomer CN2270, CN2271 and CN9001 (Sartomer, Exton Pa. USA). De-molded structures were irradiated with UV light at a typical dose of 2 J/cm$^2$ by exposure with a "D" bulb in a Fusion F450 unit (Fusion UV Systems, Inc., member of Spectris PLC, Surrey, England) with conveyor.

Sartomer CN9001, an aliphatic urethane acrylate, was found to be incompatible with wax. Rahn 01-514, a polyether acrylate, was found to release undesirable amount of VOCs when employed in the process. Rahn 01-544, a specialty resin, may be useful in various processes but is not most preferred for applications using silicone molds, as the mixture was found to swell a silicone-based mold. Sartomer CN2270, a polyester acrylate, was found to result in undesirably low viscosity, although viscosity could potentially be increased by varying the mixture ratios or by other means. Sartomer CN2271, another polyester acrylate, is presently most preferred as it was found to produce acceptable viscosity, while being compatible in the mixture and the described process with a wax thermoplastic binder—with wax MX 4462 and additionally with C-18 (1-octadecanol)—and with a silicone or silicone-based mold.

Specific experimental mixture preparation for the inventive examples I1-I5 was as follows: (1) weigh out binders both UV and wax, and photoinitiator at 1% of UV weight, in amounts appropriate to a 200 gram total batch weight of the mixture; (2) add wax and UV resin and photoinitiator to a 100° C. pre-heated 1.5 liter planetary mixer (Charles Ross and Son Company, Hauppauge, N.Y., USA) and mix 5 minutes on low speed setting; (3) add 100° C. pre-heated glass frit to mixture and mix 3 hrs on high speed setting; (4) package mixture in UV-light-blocking package while shielding from UV light to preserve desired viscosity.

With Sartomer CN2271, some slight shape slumping was observed at 5% by weight UV resin/total resin, but this potentially acceptable or may potentially be overcome by use of more photoinitiator, thus 5% appears as the lower bound of radiation-curable resin. As shown in inventive examples I1-I5 in Table I, weight percentages of total resin of 10, 15, 16, 30 and 50% were also tested successfully, although the range of 10-16% is currently most preferred in order to provide lower viscosities at typical molding temperatures. As mentioned above, at more than 50% UV resin, mold separation becomes difficult and strength of the thermally set but not-yet irradiated structure decreases undesirably.

Figure 7:
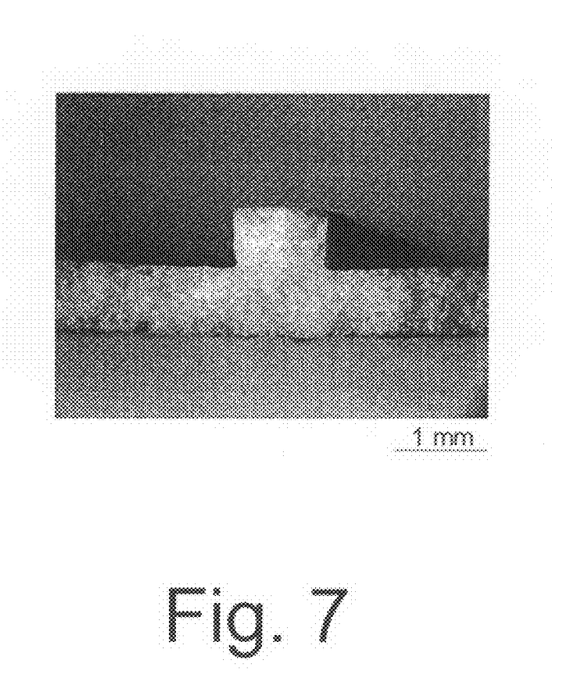
FIG. 7 is a digital photograph of a structured article produced by a process or method according to an embodiment of the present invention showing shape retention after debinding and before sintering in contrast to the article of FIG. 6.
Figure 8:
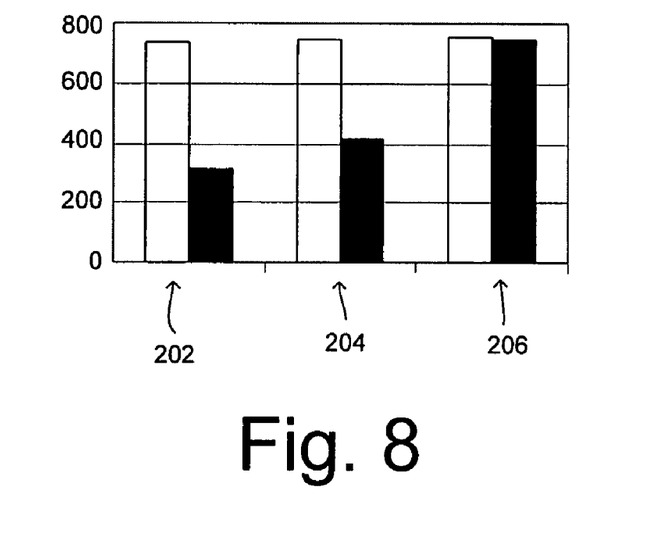
FIG. 8 is a graph of structured feature height for three structures before and after debinding, the first two being comparative and the last being an example according to the methods of the present invention.
Figure 9:
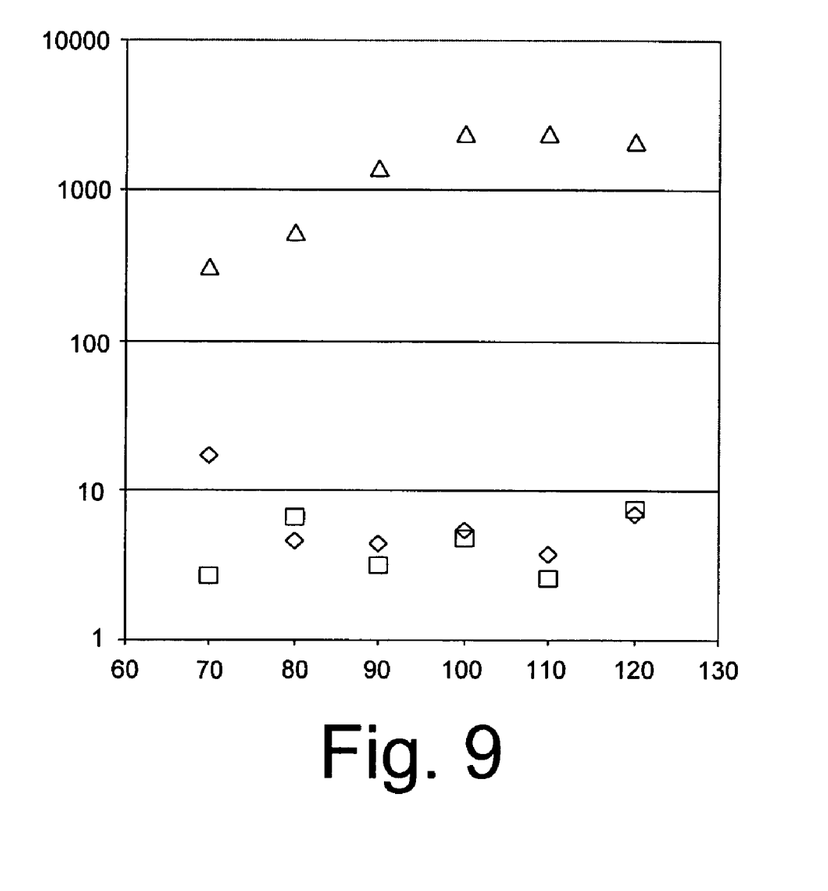
FIG. 9 is a graph of yield stress as a function of temperature for a structure undergoing a process according to one or more methods of the present invention, along with structures undergoing two comparative processes.

FIG. 7 is a digital photograph of a rectangular ridge formed using the described inventive processes, with material corresponding to inventive examples I1-I5, after debinding. As can be seen in the figure, the rectangular shape is still sharp after debinding and before sintering. Height in microns of raised features such as the rib of FIG. 7 were measured before and after debinding for glass-wax mixtures as in comparative examples C1-C5, and for UV-resin containing mixtures as in inventive examples I1-I5, both with the step of post-demolding irradiation and without. The results are shown in the graph of FIG. 8. Heights are shown in microns, before and after, for a glass-wax mixture 202, a UV-resin containing mixture without irradiation 204, and a UV-resin containing mixture with irradiation 206. It may be seen from the graph that the UV-induced cross linking has a powerful effect in maintaining the shape of structures, even through the step of debinding. That the effect is maintained—and even potentially strengthened through additional cross-linking during debinding—is shown by the results of the graph of FIG. 9, which shows measured yield stress in Pa (Pascal), as a function of temperature in degrees Celsius, for structures formed of the same three mixtures: glass-wax with no UV resin (diamonds), a glass-wax-UV resin but no irradiation in the process (rectangles), and glass-wax-UV resin with irradiation in the process (triangles). From these results it is also seen that the methods of the present invention can provide yield stresses in shaped but not yet sintered structures in excess of 100 Pa at temperatures from 70 to 120° C.

In the methods according to the present invention, the thermoplastic binder, desirably a low melting wax, remains the primary binder, including the binder that performs the function of setting the structure, allowing for mold separation and any necessary handling. This also provides for easily controlled and complete cure by simple means—cooling or allowing the structure to cool. The thermoplastic binder, particularly a low melting wax, also has good flow and lubrication properties during debinding. This minimizes cracking and other issues that might occur with a heavily crosslinked polymer as the primary binder. A sufficient amount of radiation-cured resin, desirably UV-cured resin, acts as a rheology modifier belonging to the thermoset family; therefore it does not re-melt continues to be an effective rheology modifier up to and possibly even beyond the wax debinding temperature range, as suggested by the results shown in FIG. 9.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A method of forming a microfluidic device, the method comprising the steps of:
    providing a mixture comprising a sinterable particulate material and a binder, the binder comprising, as a function of total resin content of the binder, at least 50% by weight of a thermoplastic binder material;
    shaping the mixture with a mold so as to form a structure having one or more open channels;
    setting the structure by cooling the structure or allowing the structure to cool;
    separating the structure from the mold; and
    debinding and sintering the structure, said sintering including sintering in together in contact with at least one additional structure so as to cover or enclose said channels so as to form a structured sintered article having fluidic channels formed therein,
wherein the binder further comprises at least 5% by weight of a radiation-curable binder material and the method further comprises, after the step of separating the structure from the mold, the step of irradiating the structure, so as to at least partially cure the radiation-curable binder material, and wherein the step of irradiating comprises irradiating the structure sufficiently such that the yield stress of the mixture is at least 8 Pa at temperatures in the range of 70 to 120° C.

2. The method of claim 1 wherein the thermoplastic binder material comprises one or more hydrocarbon waxes, waxy alcohols, or mixtures thereof, and the radiation-curable binder material comprises a polyester acrylate.

3. The method according to claim 1 wherein the step of providing the mixture comprises providing a mixture having a viscosity in the range of 25 to about 50 Pa·sec at a shear rate of about 2.36/second at about 75° C.

4. The method according to claim 3 wherein the step of irradiating comprises irradiating the structure sufficiently such that the yield stress of the mixture is at least 100 Pa at temperatures in the range of 70 to 120° C.

* * * * *